US006691267B1

(12) United States Patent
Nguyen et al.

(10) Patent No.: US 6,691,267 B1
(45) Date of Patent: Feb. 10, 2004

(54) TECHNIQUE TO TEST AN INTEGRATED CIRCUIT USING FEWER PINS

(75) Inventors: Khai Nguyen, San Jose, CA (US); Chiakang Sung, Milpitas, CA (US); Bonnie Wang, Cupertino, CA (US); Joseph Huang, San Jose, CA (US); Xiaobao Wang, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/094,221

(22) Filed: Jun. 9, 1998

Related U.S. Application Data

(60) Provisional application No. 60/049,478, filed on Jun. 13, 1997, provisional application No. 60/050,953, filed on Jun. 13, 1997, provisional application No. 60/049,275, filed on Jun. 10, 1997, provisional application No. 60/049,246, filed on Jun. 10, 1997, provisional application No. 60/052,990, filed on Jun. 10, 1997, provisional application No. 60/049,247, filed on Jun. 10, 1997, provisional application No. 60/049,243, filed on Jun. 10, 1997, and provisional application No. 60/049,245, filed on Jun. 10, 1997.

(51) Int. Cl.[7] .............................................. G01R 31/28
(52) U.S. Cl. ........................ 714/725; 714/744; 326/40; 326/41
(58) Field of Search ................................ 714/744, 725, 714/711, 719, 738, 718, 790, 701, 735; 710/72–75; 326/38–41, 16, 44; 365/200–201; 716/4

(56) References Cited

U.S. PATENT DOCUMENTS

| | | | |
|---|---|---|---|
| 3,761,695 A | 9/1973 | Eichelberger | 714/726 |
| 3,783,254 A | 1/1974 | Eichelberger | 708/100 |
| 3,806,891 A | 4/1974 | Eichelberger et al. | 714/731 |
| 4,267,463 A * | 5/1981 | Mayumi | 326/39 |
| 4,488,246 A * | 12/1984 | Brice | 708/232 |
| 4,488,259 A | 12/1984 | Mercy | 714/726 |
| 4,512,011 A * | 4/1985 | Turner | 370/409 |
| 4,584,673 A * | 4/1986 | Kuijk | 365/219 |
| 4,667,325 A | 5/1987 | Kitano et al. | 714/743 |
| 4,701,920 A | 10/1987 | Resnick et al. | 714/733 |
| 4,857,774 A * | 8/1989 | El-Ayat et al. | 326/16 |
| 5,175,859 A | 12/1992 | Miller et al. | 712/37 |
| 5,336,951 A | 8/1994 | Josephson et al. | 326/38 |
| 5,355,369 A | 10/1994 | Greenberger et al. | 714/727 |
| 5,361,373 A | 11/1994 | Gilson | 712/1 |
| 5,381,420 A * | 1/1995 | Henry | 714/731 |
| 5,412,260 A * | 5/1995 | Tsui et al. | 326/39 |

(List continued on next page.)

FOREIGN PATENT DOCUMENTS

WO    WO 97/06599    2/1997    ......... H03K/19/177

OTHER PUBLICATIONS

"FLEX 10K Embedded Programmable Logic Family," Altera 1996 Data Book, Jun. 1996, ver. 2, pp. 31–90.
"FLEX 8000 Programmable Logic Device Family," Altera 1996 Data Book, Jun. 1996, ver. 8, pp. 93–153.

(List continued on next page.)

Primary Examiner—Albert Decady
Assistant Examiner—Guy Lamarre
(74) Attorney, Agent, or Firm—Townsend and Townsend and Crew LLP

(57) ABSTRACT

A technique to implement functions requiring fewer pins of an integrated circuit to serially transfer data into the integrated circuit for multiple logic blocks. By reducing the required pins, this permits downbonding of the integrated circuit into a package with fewer pins. This technique may be used to implement test functions in a programmable logic device. Test data may be serially input using a test pin (310) for two or more columns (320) of logic blocks. The test data is stored in an A register (330), and may be later transferred into a B register (335).

33 Claims, 6 Drawing Sheets

U.S. PATENT DOCUMENTS

| | | | | |
|---|---|---|---|---|
| 5,489,858 A | | 2/1996 | Pierce et al. ................... | 326/56 |
| 5,491,666 A | | 2/1996 | Sturges ....................... | 365/201 |
| 5,519,715 A | * | 5/1996 | Hao et al. .................... | 714/727 |
| 5,550,843 A | | 8/1996 | Yee | |
| 5,581,564 A | | 12/1996 | Miller et al. ................ | 714/726 |
| 5,590,305 A | | 12/1996 | Terrill et al. ................ | 711/103 |
| 5,594,367 A | | 1/1997 | Trimberger et al. .......... | 326/41 |
| 5,627,842 A | | 5/1997 | Brown et al. | |
| 5,644,496 A | | 7/1997 | Agrawal et al. .............. | 716/17 |
| 5,650,734 A | | 7/1997 | Chu et al. ..................... | 326/38 |
| 5,712,858 A | * | 1/1998 | Godiwala et al. ........... | 714/724 |
| 5,717,702 A | * | 2/1998 | Stokes et al. ............... | 714/730 |
| 5,734,868 A | | 3/1998 | Curd et al. .................... | 716/5 |
| 5,737,567 A | | 4/1998 | Whittaker et al. ..... | 365/185.33 |
| 5,841,867 A | | 11/1998 | Jacobson et al. ........... | 713/187 |
| 5,864,486 A | * | 1/1999 | Deming et al. .............. | 716/17 |
| 5,869,979 A | | 2/1999 | Bocchino .................... | 326/38 |
| 5,909,450 A | * | 6/1999 | Wright ....................... | 714/724 |
| 5,909,453 A | | 6/1999 | Kelem et al. | |
| 5,936,973 A | * | 8/1999 | Lovett et al. ............... | 714/718 |
| 5,949,797 A | * | 9/1999 | Jung .......................... | 714/724 |
| 5,982,683 A | | 11/1999 | Watson et al. | |
| 5,987,621 A | * | 11/1999 | Dusso et al. ................... | 714/4 |
| 5,996,097 A | | 11/1999 | Evans et al. | |
| 6,006,343 A | * | 12/1999 | Whetsel ....................... | 714/28 |
| 6,041,050 A | * | 3/2000 | Sanders ....................... | 370/352 |
| 6,041,280 A | * | 3/2000 | Kolhi et al. ................ | 701/201 |
| 6,157,210 A | | 12/2000 | Zaveri et al. | |
| 6,191,608 B1 | * | 2/2001 | Cliff et al. .................... | 326/38 |
| 6,538,469 B1 | * | 3/2003 | Nguyen et al. ............... | 326/40 |

OTHER PUBLICATIONS

"JTAG Boundary–Scan Testing In Altera Devices," Altera Application Note 39, Nov. 1995, ver. 3, pp. 1–28.

Altera Corporation, Data Sheet, "Flex 10K Embedded Programmable Logic Family," Jul., 1995, ver. 1, pp. 1–39.

Altera Corporation, Data Sheet, "Flex 8000 Programmable Logic Device Family," Aug., 1994, ver. 4, pp. 1–22.

Altera Corporation, Data Sheet, "Max 7000 Programmable Logic Device Family," Jun. 1996, ver. 4, pp. 193–261.

Altera Corporation, Application Note 39, "JTAG Boundary––ScanTesting In Altera Devices," Nov., 1995, ver. 3, pp. 1–28.

IEEE Computer Society, "IEEE Standard Test Access Port and Boundary–Scan Architecture (IEEE Std 1149.1–1990)," Institute of Electrical and Electronics Engineers, Inc., New York, NY, Oct. 21, 1993, pp. 1–1 to 12–6 and Appendix A–1 to A–12.

IEEE Computer Society, "Supplement to (IEEE Std 1149.1–1990), IEEE Standard Test Access Port and Boundary–Scan Architecture (IEEE Std 1149.1b–1994)," Institute of Electrical and Electronics Engineers, Inc., New York, NY, Mar. 1, 1995, pp. 1–67.

Xilnix Corporation, "The Programmable Logic Data Book," 1993, pp. 1–1 to 10–8.

Xilnix Corporation, "The Programmable Logic Data Book," Section 9, 1994, pp. 9–1 to 9–32.

Xilnix Corporation, "The Programmable Logic Data Book," Product Description, "XC2000 Logic Cell Array Families," Aug. 1994, pp. 2–187–2–216.

Xilnix Corporation, "The Programmable Logic Data Book," Product Description, "XC3000, XC3000A, XC000L., SC3100, XC3100A Logic Cell Array Families," pp. 2–105 to 2–152.

Xilnix Corporation, "The Programmable Logic Data Book," Product Specification, "XC4000 Series Field Programmable Gate Arrays," Jul. 30, 1996, version 1.03, pp. 4–5 to 4–76.

* cited by examiner

TECHNIQUE TO TEST AN INTEGRATED CIRCUIT USING FEWER PINS

This application claims the benefit of a U.S. provisional application No. 60/049,275, filed Jun. 10, 1997; No. 60/049,478, filed Jun. 13, 1997; No. 60/049,246, filed Jun. 10, 1997; No. 60/052,990, filed Jun. 10, 1997; No. 60/049,247, filed Jun. 10, 1997; No. 60/049,243, filed Jun. 10, 1997; No. 60/050,953, filed Jun. 13, 1997; and No. 60/049,245, filed Jun. 10, 1997, all of which are incorporated herein by reference.

BACKGROUND OF THE INVENTION

The present invention relates to the field of integrated circuits, and more specifically to techniques to reduce the utilization of external pins in implementing integrated circuit functionality.

Semiconductor technology continues to improve. This technology allows greater and greater functionality to be provided by a single integrated circuit or "chip." Signals are input to and output from the chip using external pins or pads. The chip interfaces to external circuitry, possibly on other chips, using the external pins.

Many functions such as testing and configuration of an integrated circuit are performed using the external pins. An integrated circuit may be packaged in a package having a sufficient number external pins to bond to all the pads of the integrated circuit. However, it is also desirable that the same integrated circuit may be packaged or "downbonded" into a smaller package with fewer external pins. Smaller packages may be desirable because of their reduced cost. For example, it is desirable to use a package size that provides a sufficient number of I/Os. And, a larger package size is not used because the additional I/Os would be left unused.

It is important that functions such as testing and configuration remain accessible even when the integrated circuit is downbonded into a smaller package. Consequently, there is a need for techniques of implementing functions in integrated circuits to facilitate downbonding of the integrated circuit into a package with fewer pins.

SUMMARY OF THE INVENTION

The present invention is a technique of implementing functionality on an integrated circuit to facilitate downbonding of the integrated circuit into packages with fewer pins. Furthermore, in a specific embodiment, the present invention is a technique to reduce the number of required test pins, especially for low-pin count packages. Downbonding is desirable since it provides the customer with a wide range of package choices and the option to get a low-pin count package of the same device for much lower price.

As a specific example, in a programmable integrated circuit such as a programmable logic device (PLD), test data may be serially input using a single test pin into the integrated circuit in serial for two (or more) columns of logic array blocks, instead of one column. Many columns may be input in parallel using a plurality of test pins.

Test data is input using the test pin, and is stored in a first register. This test data is then transferred in parallel to a second register. From the second register, the test data may be transferred to the logic array blocks for testing of the logic array blocks. The technique of the present invention will provide the same full test coverage of the device. With fewer number of test pins, the device can be downbonded to the smaller pin count packages.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
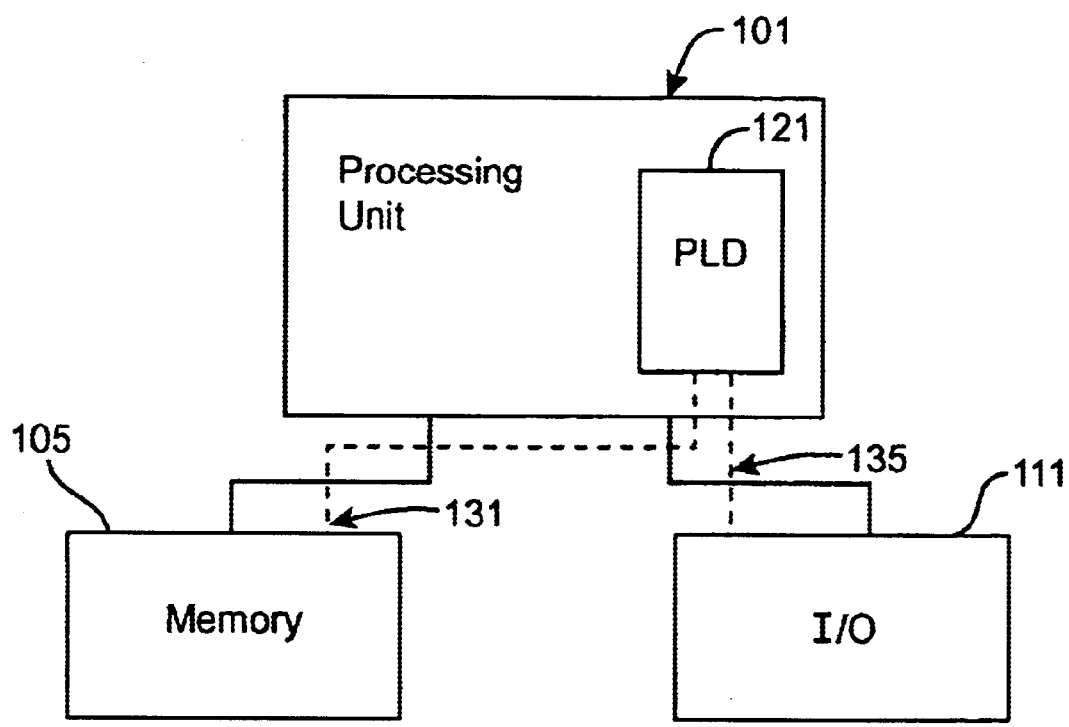
FIG. 1 shows a digital system incorporating a programmable logic device.

FIG. 1 shows a block diagram of a digital system. The system may be provided on a single board, on multiple boards, or even within multiple enclosures linked by electrical conductors or a network (e.g., a local area network or the internet). This digital system may be used in a wide variety of applications and industries including networking, telecommunications, automotive, control systems, consumer electronics, computers, workstations, military, industrial, digital processing, and many others. In the embodiment of FIG. 1, a processing unit 101 is coupled to a memory 105 and an I/O 111. Further, a programmable logic device (PLD) 121 is incorporated within this digital system. PLD 121 may be specially coupled to memory 105 through connection 131 and to I/O 111 through connection 135.

Programmable logic devices (PLDs) are sometimes also referred to as PALs, PLAs, FPLAs, CPLDs, EPLDs, EEPLDs, LCAs, or FPGAs. PLDs are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® and FLEX® series of devices. The former are described in, for example, U.S. Pat. Nos. 5,241,224 and 4,871,930, and the *Altera Data Book*, June 1996, all incorporated herein by reference in their entirety for all purposes. The latter are described in, for example, U.S. Pat. Nos. 5,258,668, 5,260,610, 5,260,611, and 5,436,575, and the *Altera Data Book*, June 1996, all incorporated herein by reference in their entirety for all purposes.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed or configured to implement the logical functions necessary to carry on its particular role in system operation.

Figure 2:
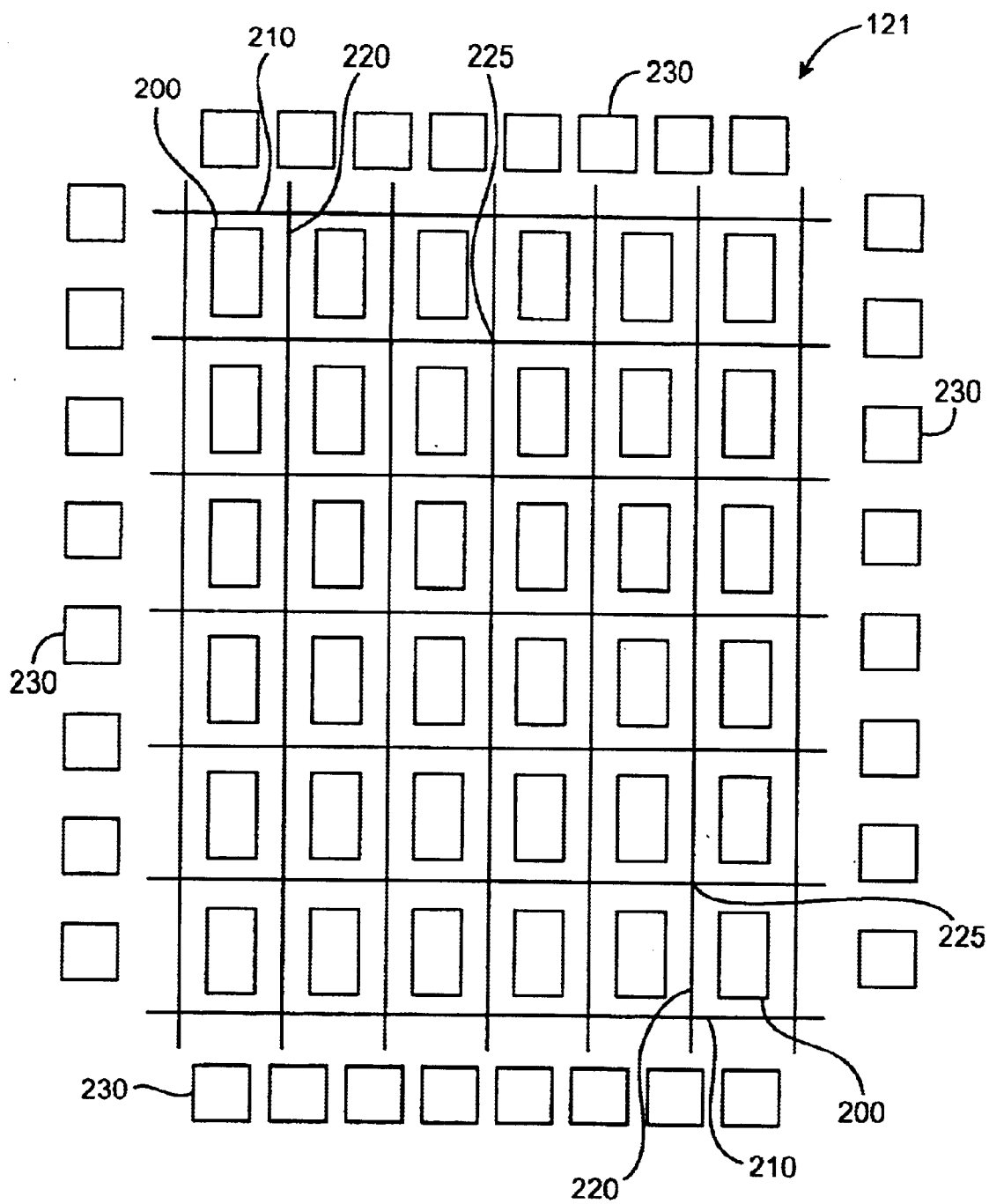
FIG. 2 shows an block diagram of a programmable logic device.

FIG. 2 shows a simplified block diagram of the overall internal architecture and organization of a programmable logic device integrated circuit, such as PLD 121 of FIG. 1. Many details of PLD architecture, organization, and circuit design are not necessary for an understanding of the present invention and such details are not shown in FIG. 2. Further details of a specific architecture such as shown in FIG. 2 are discussed in Altera Corp., "FLEX® 8000," in 1996 *Data Book,* June 1996 and Altera Corp., "FLEX® 10K," in 1996 *Data Book,* June 1996.

To briefly describe a PLD architecture, FIG. 2 shows a six-by-six two-dimensional array of thirty-six logic array blocks (LABs) 200. A PLD may have any number of LABs, and in any arrangement including square and rectangular arrays of LABs. LAB 200 is a physically grouped set of logical resources that is configured or programmed to perform logical functions. LAB 200 has inputs and outputs (not shown) which may or may not be programmably connected to a global interconnect structure.

The global interconnect structure includes an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200. FIG. 2 further shows at the peripheries of the chip, input-output drivers 230. Input-output drivers 230 are for interfacing the PLD to external, off-chip circuitry.

It is common for programmable integrated circuits, especially high-density PLDs (such as Altera's FLEX® 8000 and FLEX® 10K), to have many different package types for the same device. For example, a particular PLD integrated circuit may be packaged in different package sizes such as a 160-pin package, 144-pin package, 100-pin package, 84-pin package, or package with other number of pins. An integrated circuit may be fabricated with 160 pads. When packaged in a 160-pin package, the 160 pads will be bonded to the 160 external pins of the package. However, when packaged in a 144-pin package, only a selected 144 pads (of the 160) will be bonded to the external pins. The packaging of an integrated circuit into a smaller package is referred to as "downbonding."

An advantage of a larger package size is there will be more pins available for input and output of data, which generally results in higher performance. However, a larger package is more costly since the package cost will be greater, and also the larger package will take up more area on a printed circuit board (PC board). A larger number of external pins may also require a more expensive multilayered PC board.

To facilitate downbonding, it is important that the integrated circuit be able to provide its functionality in a lower pin count package. For example, a PLD has a function to facilitate testing of the device. Test data is input into the device to test the logic on the integrated circuit. The test functionality may be used to ensure the programmable integrated circuit is working properly after it has been configured.

Figure 3:
FIG. 3 shows a technique for testing a programmable integrated circuit.

FIG. 3 illustrates a technique for testing an integrated circuit. There is a test pin 310 (TPIN) associated with each LAB column 320. Each LAB column has an A register 330 and a B register 335. In a specific embodiment, the A register and B register have 16 bits or storage elements per column. In other embodiments, the register may have any number of bits, such as 8, 24, or 32. A latch or D flip-flop may be used to implement each element in the registers. The elements implementing the A register are arranged in a serial chain much like a large shift register.

In operation, TPIN is used to serially input data into the A register. A DRATCLK clock input is used to clock data into the A register. For example, 16 bits of data may be serially input at TPIN for its respective LAB column using 16 clock pulses at DRATCLK. After a frame of 16 bits of test data has been loaded into the A register, a DRBTCLK clock input is used to clock these 16 bits of data in parallel into the B register. And, the test data may be transferred in parallel to 16 FIFO chains in the core of a LAB column, where the test data will be utilized.

The configuration shown in FIG. 3, however, may not be workable if a particular integrated circuit were downbonded to a smaller package because there will be fewer pins available to be test pins (TPINs). For example, if a test pin is omitted, it will not be possible to test the particular LAB column associated with that test pin. A technique to permit full-coverage testing functionality and also facilitate downbonding is shown in FIG. 4.

Figure 4:
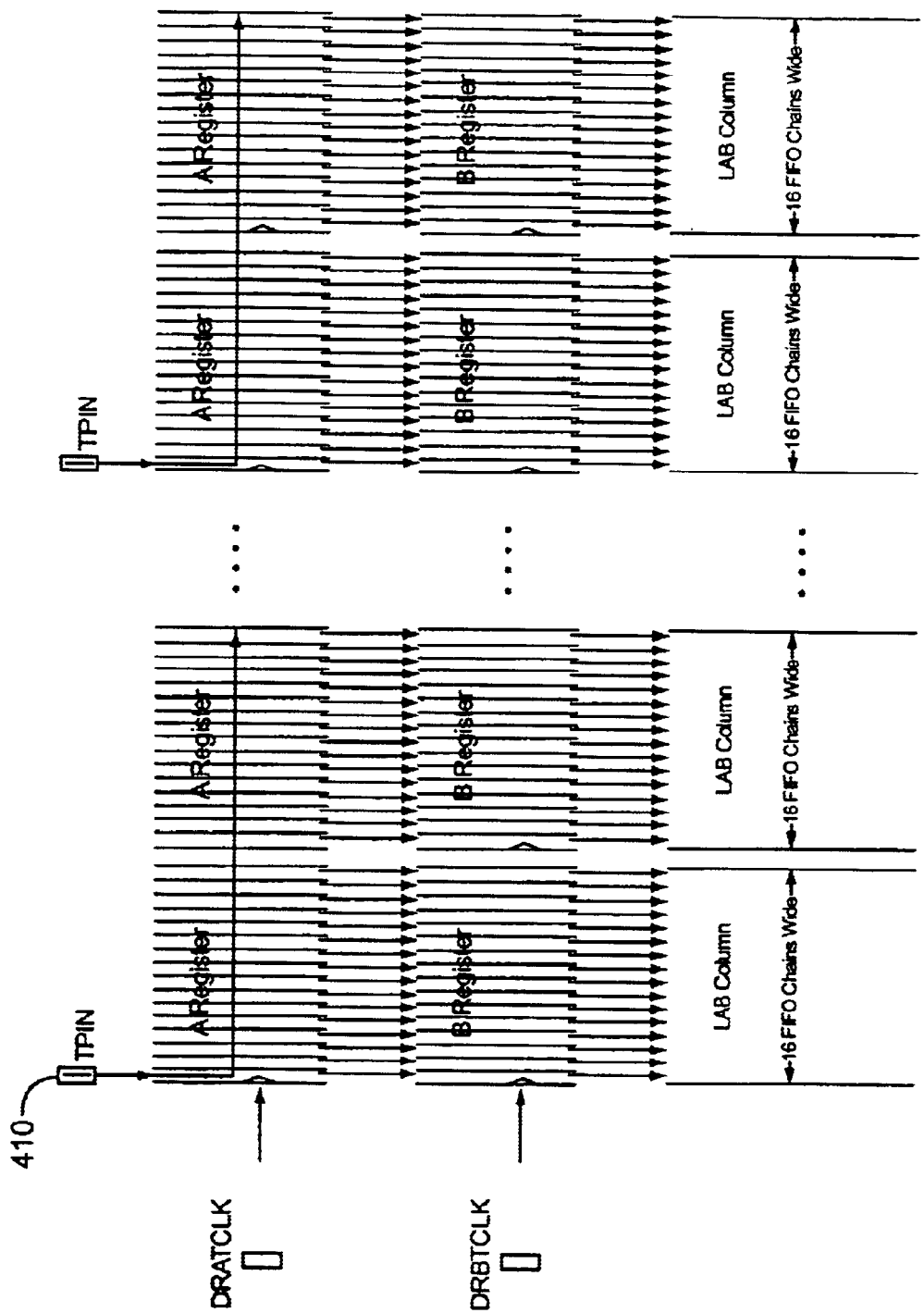
FIG. 4 shows a technique for testing the programmable integrated circuit using fewer pins.

FIG. 4 shows an approach where a test pin 410 (TPIN) is shared between two LAB columns. Compared to the approach in FIG. 3, only half as many test pins 410 are required. This approach may be similarly extended so that a TPIN is associated with any number of multiple columns. For example, TPIN 410 will be used to input test data for two LAB columns (as in FIG. 4), or three columns, four columns, five columns, or even greater numbers of columns. By sharing a single TPIN with multiple columns of LABs, fewer external pins are required to perform the test function.

In operation, for FIG. 4, test data is serially loaded into the A register using TPIN 410 and clock pin DRATCLK. Two columns of test data are entered using 32 clock cycles (as compared to the 16 clock cycles for FIG. 3). It may take a slightly longer period of time to input or program a test pattern into the data register, but overall, this technique will still provide the same full test coverage and functionality of the device. Once a frame of data (e.g., in FIG. 4, 32 bits of data) is loaded into the A register, the data is then loaded in parallel into the B register, and then transferred to the FIFO chains in the core. The LAB core will be tested using the test data.

As can be appreciated, because fewer test pin are required, the programmable integrated circuit may be downbonded to the smaller pin count packages, and still allow the same full coverage test capability.

Figure 5:
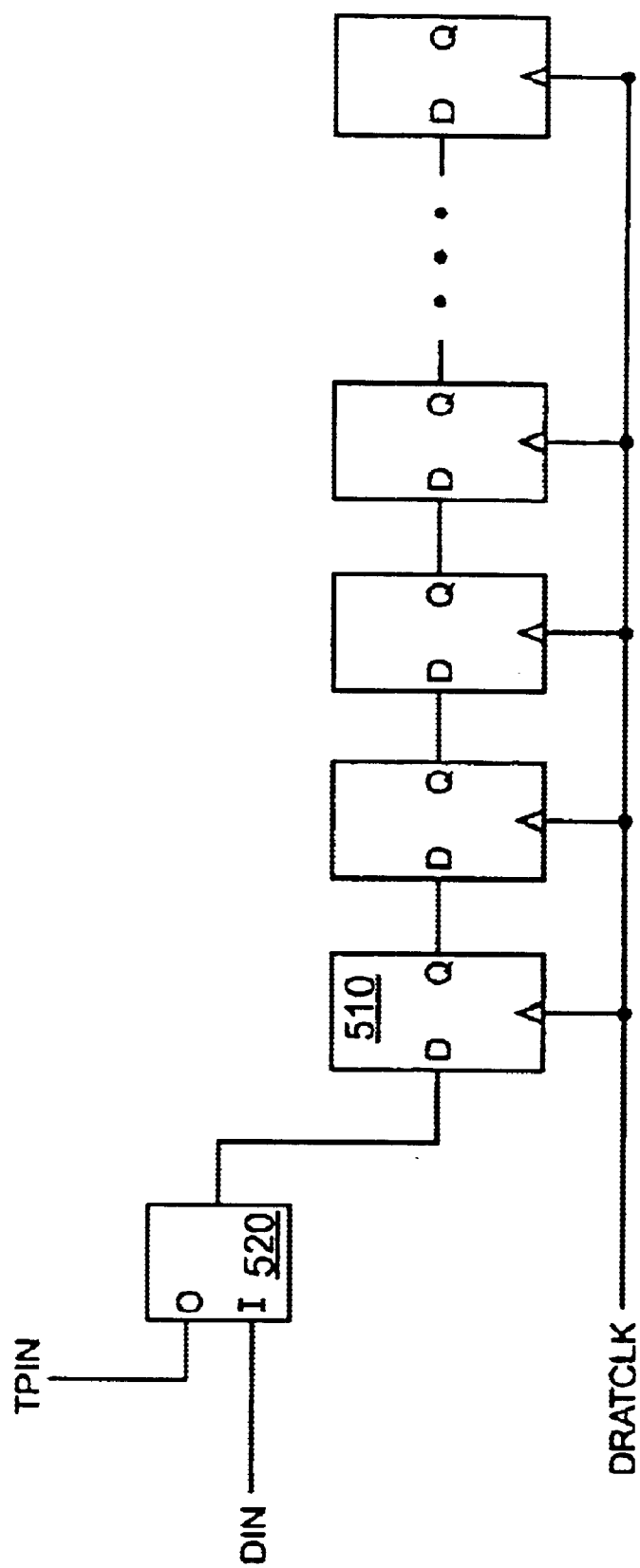
FIG. 5 shows circuitry to implement a register for testing of the programmable integrated circuit.

FIG. 5 shows a circuit implementation for a register such as the A register 330 for testing. These registers are arranged in a serial chain, where each flip-flop 510 stores a single bit of test data. TPIN may be selected to input a first flip-flop 510 in the serial chain through a multiplexer 520. Input of the first flip-flop 510 may also come from a DIN input, which may be an internal (to the chip) or external test data source. Test data is clocked in serially using the DRATCLK clock input. There may be any number of flip-flops 510 arranged as shown in FIG. 5. For example, for the embodiment of FIG. 4, there would be a sufficient number of number of flip-flops 510 for two columns (e.g., 32) of logic blocks.

Figure 6:
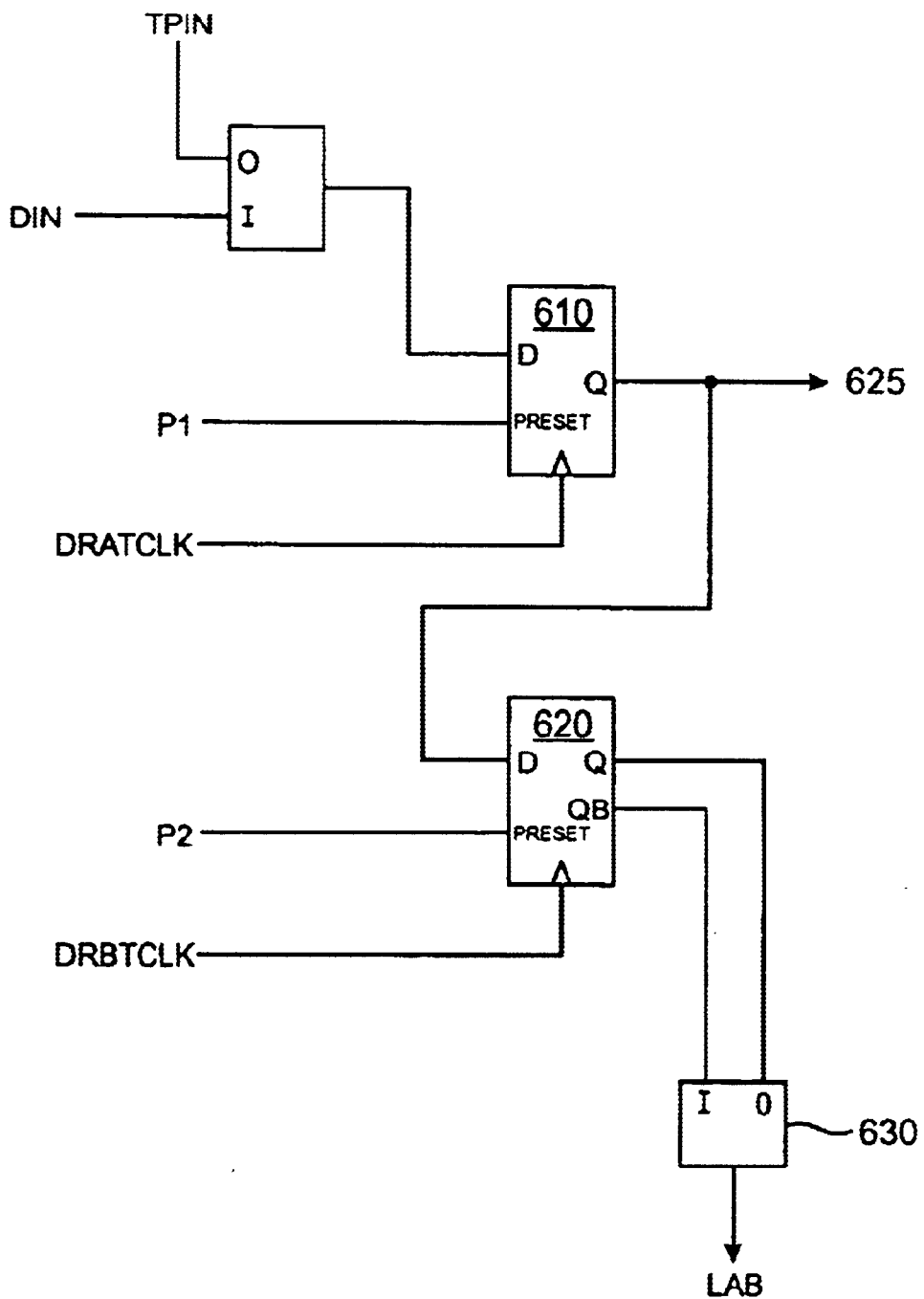
FIG. 6 shows circuitry to implement two levels of registers for testing.

FIG. 6 shows how a single flip-flop in the A register 330 is coupled to a single flip-flop the B register 335. This diagram is like a "bit slice" of the A and B registers. The A and B registers may be made of any arbitrary size by extending the number of flip-flops in parallel.

In FIG. 6, a flip-flop 610 is for the A register, and a flip-flop 620 is for the B register. An output 625 of flip-flop 610 is coupled to an input of flip-flop 620. This output of flip-flop 610 is also coupled to the next flip-flop in the serial chain for the A register (see FIG. 5). There is a Q and QB output for flip-flop 625. Either of these outputs may be input to the LAB, and is selected using a multiplexer 630. Flip-flop 610 may be preset using a P1 input, and flip-flop 620 may be preset using a P2 input. The flip-flops may be preset upon power-up of the integrated circuit to ensure to the flip-flops are in a known state. Other features in FIG. 6 are similar to features discussed with regard to other figures.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize and practice the invention in various embodiments and with various modifications as are suited to the particular use contemplated. It is intended that the scope of the invention be defined by the following claims.

What is claimed is:

1. A method of testing a programmable integrated circuit comprising:
    transferring in serial via a test pin a frame of test bits to a first register, wherein the frame comprises bits for a plurality of columns of logic array blocks;
    transferring in parallel the frame of test bits in the first register to a second register; and
    using the frame of test bits from the second register to test a plurality of columns of logic array blocks.
2. The method of claim 1 wherein the transferring in serial is in response to a signal on a first clock line.
3. The method of claim 2 wherein the transferring in parallel is in response to a signal on a second clock line.
4. The method of claim 1 further comprising:
    transferring in parallel the frame of test bits into FIFO chains within a plurality of columns of logic array blocks.
5. The method of claim 1 wherein the first register comprises:
    a plurality of flip-flops arranged in a serial chain, wherein a first flip-flop in the serial chain is selectively coupled to the test pin.
6. The method of claim 1 wherein a first storage element of the first register is coupled to a second storage element of the first register and a first storage element of the second register.
7. The method of claim 6 wherein the first register may be preset using a first preset input and the second register may be preset using a second preset input.
8. The method of claim 1 wherein the first register comprises at least 32 bits.
9. The method of claim 6 wherein an output and an inverted output from the second register may be selectively passed to a logic array block.
10. A method of testing a programmable integrated circuit comprising:
    clocking in test data into the programmable integrated circuit using a plurality of test pins wherein the test data input via a test pin is for a plurality of columns of logic blocks of the programmable integrated circuit;
    storing the test data in a first register;
    transferring the test data from the first register to a second register in parallel; and
    testing the programmable integrated circuit storing the test data in a first register;
    transferring the test data from the first register to a second register in parallel using the test data.
11. A method of testing a programmable integrated circuit as recited in claim 10 utilized to test a programmable integrated circuit that has been downbonded.
12. The method of claim 10 wherein at least 32 bits of test data are clocked in at each test pin.
13. The method of claim 10 further comprising:
    transferring the test data input using a test pin to FIFO chains in a plurality of columns of logic blocks.
14. The method of claim 10 wherein each test pin is used to input data for two columns of logic blocks.
15. A method of testing an integrated circuit including an array of logic blocks arranged in rows and columns and an interconnect structure comprising a plurality of first conductors between columns of the logic blocks and a plurality of second conductors between the rows of the logic blocks, the method comprising:
    serially receiving a frame of test bits with a test pin;
    storing the frame of test bits using a first register, the first register selectively coupled to the test pin;
    receiving in parallel the frame of test bits from the first register using a second register, the second register coupled to the first register; and
    testing a plurality of columns of logic blocks with the frame of test bits from the second register.
16. The method of claim 15 further comprising:
    while serially receiving the frame of test bits with the test pin, clocking the first register with a first clock signal on a first clock line.
17. The method of claim 16 further comprising:
    while receiving in parallel the frame of test bits from the first register using a second register, clocking the second register with a second clock signal on a second clock line.
18. The method of claim 15 wherein the first register comprises:
    a first clock line; and
    a plurality of flip-flops arranged in a serial chain, wherein a first flip-flop in the serial chain is selectively coupled to the test pin.
19. The method of claim 18 wherein the first flip-flop in the first register is coupled to a second flip-flop in the first register and a first flip-flop in the second register.
20. The method of claim 19 wherein the first register comprises at least 32 flip-flops.
21. The method of claim 20 wherein the integrated circuit further comprises:
    a multiplexer having a first input, a second input, and an output, wherein the first input is coupled to a output of the first flip-flop in the second register and the second input is coupled to an inverting output of the first flip-flop in the second register.

22. The method of claim 20 wherein the integrated circuit further comprises:
a multiplexer having a first input, a second input, and an output, wherein the first input is coupled to the test pin and the output is coupled to the first flip-flop in the first register.

23. A method of testing an integrated circuit including an array of logic blocks arranged in rows and columns and an interconnect structure comprising first conductors between columns of the logic blocks and second conductors between rows of the logic blocks, the method comprising:
receiving a plurality of signals external to the integrated circuit with a plurality of test pins, wherein the plurality of signals comprises test data; and
testing at least two columns of logic blocks with test data received by each test pin, wherein the integrated circuit further comprises:
a first register for two columns of logic blocks, wherein data is loaded into the first register via one test pin; and
a second register for two columns of logic blocks, wherein data stored in the first register is loaded into the second register in parallel.

24. The method of claim 23 wherein the integrated circuit further comprises:
a first plurality of flip flops coupled in a chain, wherein a first flip flop in the chain is selectably coupled to a test pin.

25. The method of claim 23 wherein the integrated circuit further comprises:
a first multiplexer coupled to selectively pass a first signal from a test pin or a second signal to a first multiplexer output;
a first flip flop coupled to the first multiplexer output;
a second flip flop, coupled to a first flip flop output; and
a second multiplexer, coupled to a second flip flop output, and a second multiplexer output coupled to a logic block.

26. The method of claim 25 wherein the first flip flop is further coupled to a first clock signal and the second flip flop is further coupled to a second clock signal.

27. The method of claim 25 wherein the second multiplexer is further coupled to a second flip flop inverted output.

28. A method of testing an integrated circuit comprising:
serially receiving a plurality of test bits using a test pin;
storing the plurality of test bits in a first register, the first register comprising a first flip-flop having an input selectively coupled to the test pin, and a second flip-flop having an input coupled to an output of the first flip-flop;
transferring in parallel the test bits from the first register to a second register, the second register comprising a third flip flop having an input coupled to the output of the first flip-flop in the first register; and
testing a plurality of columns of logic blocks using the test bits from the second register.

29. The method of claim 28 further comprising:
while serially receiving the plurality of test bits using the test pin, clocking the first register with a first clock signal on a first clock line.

30. The method of claim 29 further comprising:
while transferring in parallel the plurality of test bits from the first register to the second register, clocking the second register with a second clock signal on a second clock line.

31. A method of testing an integrated circuit including an array of logic blocks arranged in rows and columns and an interconnect structure comprising a plurality of first conductors between columns of the logic blocks and a plurality of second conductors between the rows of the logic blocks, the method comprising:
serially receiving a frame of test bits with a test pin;
storing the frame of test bits using a first register, the first register selectively coupled to the test pin;
receiving in parallel the frame of test bits from the first register using a second register, the second register coupled to the first register;
selectively providing each test bit or its complement in the frame of test bits to a column of logic blocks in a plurality of columns of logic blocks; and
testing the plurality of columns of logic blocks.

32. The method of claim 31 wherein the selectively proving each test bit or its complement is done using a multiplexer.

33. The method of claim 32 wherein the first register comprises a first plurality of flip-flops coupled in series, and the second register comprises a second plurality of flip-flops, each having an input coupled to an output of a flip-flop in the first plurality of flip-flops.

* * * * *